US012628464B2

(12) United States Patent　　(10) Patent No.:　US 12,628,464 B2

Lu et al.　　(45) Date of Patent:　May 12, 2026

(54) SYSTEMS AND METHODS FOR STACKED SENSORS WITH ELECTRICAL INSULATION

(71) Applicant: SHENZHEN ADAPS PHOTONICS TECHNOLOGY CO., LTD., Shenzhen City (CN)

(72) Inventors: Ching-Ying Lu, Shenzhen (CN); Yangsen Kang, San Jose, CA (US); Shuang Li, Shenzhen (CN)

(73) Assignee: SHENZHEN ADAPS PHOTONICS TECHNOLOGY CO., LTD., Shenzhen City (CN)

( * ) Notice: Subject to any disclaimer, the term of this patent is extended or adjusted under 35 U.S.C. 154(b) by 712 days.

(21) Appl. No.: 17/932,559

(22) Filed: Sep. 15, 2022

(65) Prior Publication Data

US 2024/0097052 A1　Mar. 21, 2024

(51) Int. Cl.
| | |
|---|---|
| *H01L 31/02* | (2006.01) |
| *H01L 31/107* | (2006.01) |
| *H10F 30/225* | (2025.01) |
| *H10F 77/00* | (2025.01) |
| *H10F 39/10* | (2025.01) |

(52) U.S. Cl.
CPC ......... *H10F 77/959* (2025.01); *H10F 30/225* (2025.01); *H10F 77/933* (2025.01); *H10F 39/103* (2025.01); *H10F 39/107* (2025.01)

(58) Field of Classification Search
CPC .... H10F 77/959; H10F 30/225; H10F 77/933; H10F 39/103; H10F 39/107; H10F 39/018; H10F 39/809; H10F 39/807; H10F 39/811
See application file for complete search history.

(56) References Cited

U.S. PATENT DOCUMENTS

| | | | |
|---|---|---|---|
| 2021/0296377 A1* | 9/2021 | Lu .......................... | H10F 39/805 |
| 2022/0350027 A1* | 11/2022 | Nishino ................ | G01S 17/931 |
| 2022/0375980 A1* | 11/2022 | Neya ...................... | H10D 84/00 |
| 2022/0384493 A1* | 12/2022 | Takatsuka ........... | H10F 39/8033 |
| 2025/0119663 A1* | 4/2025 | Sekine ................. | H04N 23/667 |
| 2025/0120213 A1* | 4/2025 | Ejiri .................... | H10F 30/2255 |
| 2025/0126921 A1* | 4/2025 | Morimoto ........... | H01L 23/5228 |

* cited by examiner

*Primary Examiner* — Jarrett J Stark

(57) ABSTRACT

The present invention relates generally to sensing devices. A stacked SPAD sensor device includes a sensor layer and a logic layer. The sensor layer includes a plurality of SPAD pixels and a peripheral region surrounding the SPAD pixels. An insulation region is configured between the SPAD pixels and the peripheral region to provide electrical insulation. The logic layer includes logic circuits coupled to SPAD pixels. The logic circuits are electrically insulated from the SPAD pixels by the insulation region. There are other embodiments as well.

11 Claims, 6 Drawing Sheets

300

SYSTEMS AND METHODS FOR STACKED SENSORS WITH ELECTRICAL INSULATION

BACKGROUND OF THE INVENTION

The present invention relates generally to sensing devices.

Research and development in integrated microelectronics have continued to produce astounding progress with sensor devices. Many examples of photodiodes exist. For example, a photodiode is a p-n junction or PIN structure. When a photon of sufficient energy strikes the diode, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus, as holes move toward the anode (electrons move toward the cathode), a photocurrent is produced. The total current through the photodiode is the sum of the dark current (current that is generated in the absence of light) and the photocurrent, so the dark current must be minimized to maximize the sensitivity of the device.

Another example of a photodiode is called an "avalanche photodiode". The avalanche photodiodes are photodiodes with a structure optimized for operating with high reverse bias, approaching the reverse breakdown voltage. This allows each photo-generated carrier to be multiplied by avalanche breakdown, resulting in internal gain within the photodiode, which increases the effective sensitivity of the device. A type of photodiode—usually referred to as a single-photon avalanche diode (SPAD) device—has been gaining popularity and used in a variety of applications, such as LIDAR systems that have become a mainstream component of consumer electronics, automobiles, and other applications.

Over the past, there have been various conventional implementations of SPAD sensors, but they have been inadequate. Techniques for improving sensing devices are highly desired.

BRIEF SUMMARY OF THE INVENTION

The present invention relates generally to sensing devices. A stacked SPAD sensor device includes a sensor layer and a logic layer. The sensor layer includes a plurality of SPAD pixels and a peripheral region surrounding the SPAD pixels. An insulation region is configured between the SPAD pixels and the peripheral region to provide electrical insulation. The logic layer includes logic circuits coupled to SPAD pixels. The logic circuits are electrically insulated from the SPAD pixels by the insulation region. There are other embodiments as well.

According to an embodiment, the present invention provides a stacked SPAD sensor device that includes a sensor layer characterized by a first thickness. The device also includes a logic layer characterized by a second thickness. The device also includes a bonding layer characterized by a third thickness, the bonding layer being positioned between the sensor layer and the logic layer. The device also includes an array of SPAD pixel circuits configured in the sensor layer, the array of SPAD pixel circuits including a first pixel circuit and a second pixel circuit, the first pixel circuit may include a first p-n junction positioned and a first substrate between a first sidewall and a second sidewall, the first p-n junction being characterized by a first operating voltage of at least 10 volts, the second pixel circuit may include a second p-n junction and a second substrate positioned between the second sidewall and a third sidewall. The device also includes a first logic circuit positioned in the logic layer. The device also includes one or more insulation walls surrounding the array of SPAD pixel circuits, the one or more insulation walls positioned in the sensor layer, the first substrate being electrically insulated from the logic layer. The device also includes a first electrical connector positioned in the bonding layer, the first electrical connector being coupled to the first p-n junction and the first logic circuit.

Implementations may include one or more of the following features. The stacked SPAD sensor device where the one or more insulation walls may include four walls enclosing the array of SPAD pixel circuits. The first logic circuit is characterized by a second operating voltage of 5 volts or less. The stacked SPAD sensor device may include: a second logic circuit positioned in the logic layer; and a second electrical connector positioned in the bonding layer, the second electrical connector being coupled to the second p-n junction and the second logic circuit. The one or more insulation walls are characterized by a fourth thickness, the fourth thickness being no greater than the first thickness. The stacked SPAD sensor device may include a floating region positioned adjacent to the one or more insulation walls, the floating region being electrically insulated from the array of SPAD pixel circuits. The stacked SPAD sensor device may include a first passivation layer overlaying the first substrate and a second passivation layer overlaying the second substrate. The first sidewall may include a deep trench isolation structure. The stacked SPAD sensor device may include top metal contacts configured on a top side of the sensor layer, the first electrical connector being electrically coupled to a bottom side of the sensor layer. The stacked SPAD sensor device may include a floating region positioned adjacent to the one or more insulation walls, the floating region being electrically grounded. The stacked SPAD sensor device may include a floating region positioned adjacent to the one or more insulation walls, the float region may include a dicing surface.

According to another embodiment, the present invention provides a stacked SPAD sensor device also includes a sensor layer characterized by a first thickness. The device also includes a logic layer characterized. The device also includes a bonding layer interfacing between the sensor layer and the logic layer. The device also includes a SPAD pixel circuit may include a p-n junction positioned and a substrate between a first sidewall and a second sidewall. The device also includes a logic circuit positioned in the logic layer. The device also includes an insulation region that may include a non-conductive material characterized by a second thickness. The device also includes an insulation wall separating the SPAD pixel circuit and the insulation region, the insulation wall being positioned in the sensor layer, the substrate being electrically insulated from the logic layer.

According to another embodiment, the present invention provides a stacked SPAD sensor device also includes a sensor layer characterized by a first thickness. The device also includes a logic layer characterized. The device also includes a bonding layer interfacing between the sensor layer and the logic layer. The device also includes a SPAD pixel circuit that may include a p-n junction positioned and a substrate between a first sidewall and a second sidewall. The device also includes a logic circuit positioned in the logic layer. The device also includes an insulation region positioned in the sensor layer and coupled to a ground terminal. The device also includes an insulation wall separating the SPAD pixel circuit and the insulation region, the insulation wall positioned in the sensor layer, the substrate being electrically insulated from the logic layer.

Implementations may include one or more of the following features. The stacked SPAD sensor device where the insulation region is coupled to the ground terminal through the bonding layer. The logic circuit is characterized by a second operating voltage of lower than 6 volts. The bonding layer may include a copper-to-copper bonding interface. Implementations of the described techniques may include hardware, a method or process, or computer software on a computer-accessible medium.

It is to be appreciated that embodiments of the present invention provide many advantages over conventional techniques. Among other things, SPAD sensor devices and electrical insulation structures thereof can significantly improve device reliability and performance. Additionally, insulation structures according to embodiments of the present invention improve device implementation flexibility, as dicing and packaging of SPAD sensor device are simplified when undesirable electrical shorting between logic circuit and SPAD sensor circuit is prevented by the electrical insulation structures.

Embodiments of the present invention can be implemented in conjunction with existing systems and processes. For example, SPAD sensor devices according to the present invention can be used in a wide variety of applications, such as lidar devices, autonomous vehicles, and many others. Additionally, SPAD sensor devices, with electrical insulation structures, can be manufactured using existing processes and manufacturing equipment, and they can be readily adopted. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1A:
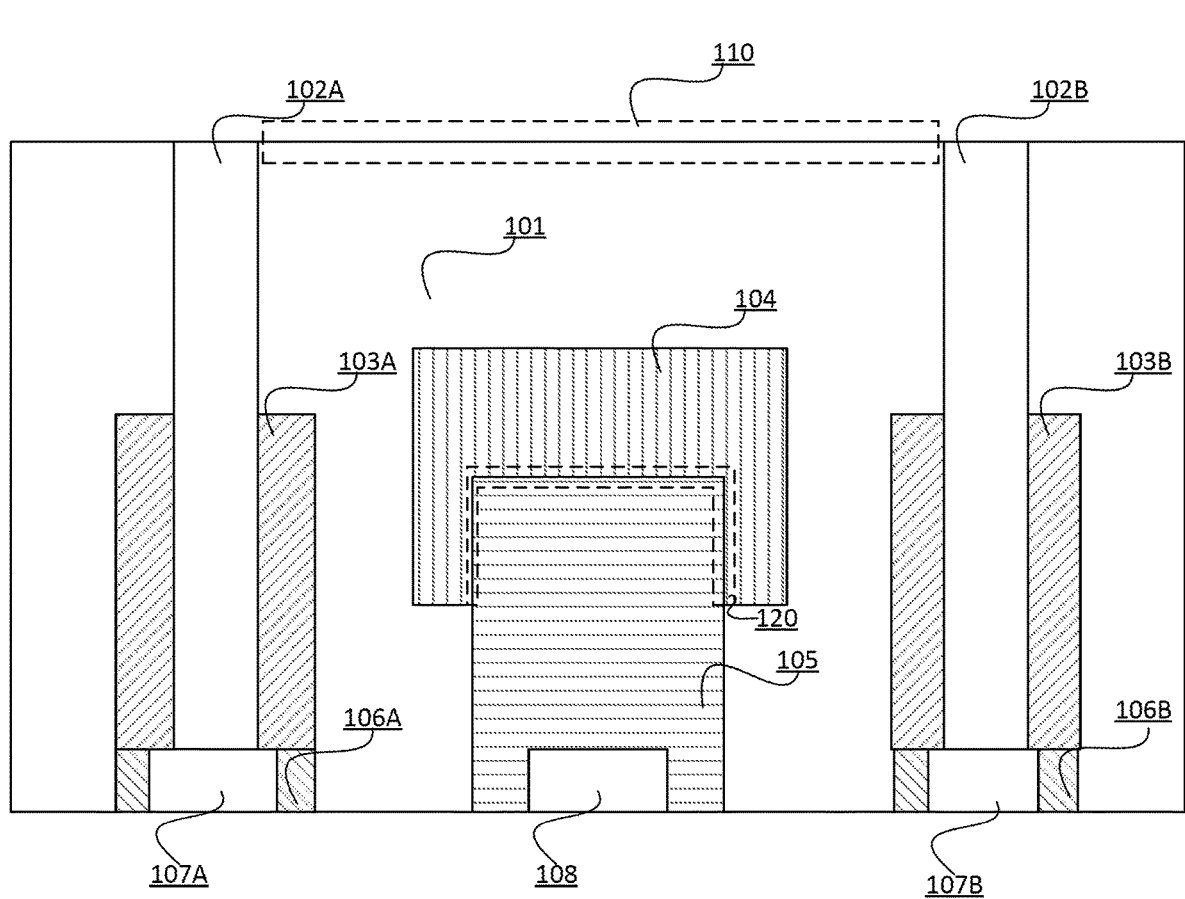
FIGS. 1A and 1B are simplified diagrams illustrating a SPAD pixel device 100 according to embodiments of the present invention.

The present invention relates generally to sensing devices. A stacked SPAD sensor device includes a sensor layer and a logic layer. The sensor layer includes a plurality of SPAD pixels and a peripheral region surrounding the SPAD pixels. An insulation region is configured between the SPAD pixels and the peripheral region to provide electrical insulation. The logic layer includes logic circuits coupled to SPAD pixels. The logic circuits are electrically insulated from the SPAD pixels by the insulation region. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1B:
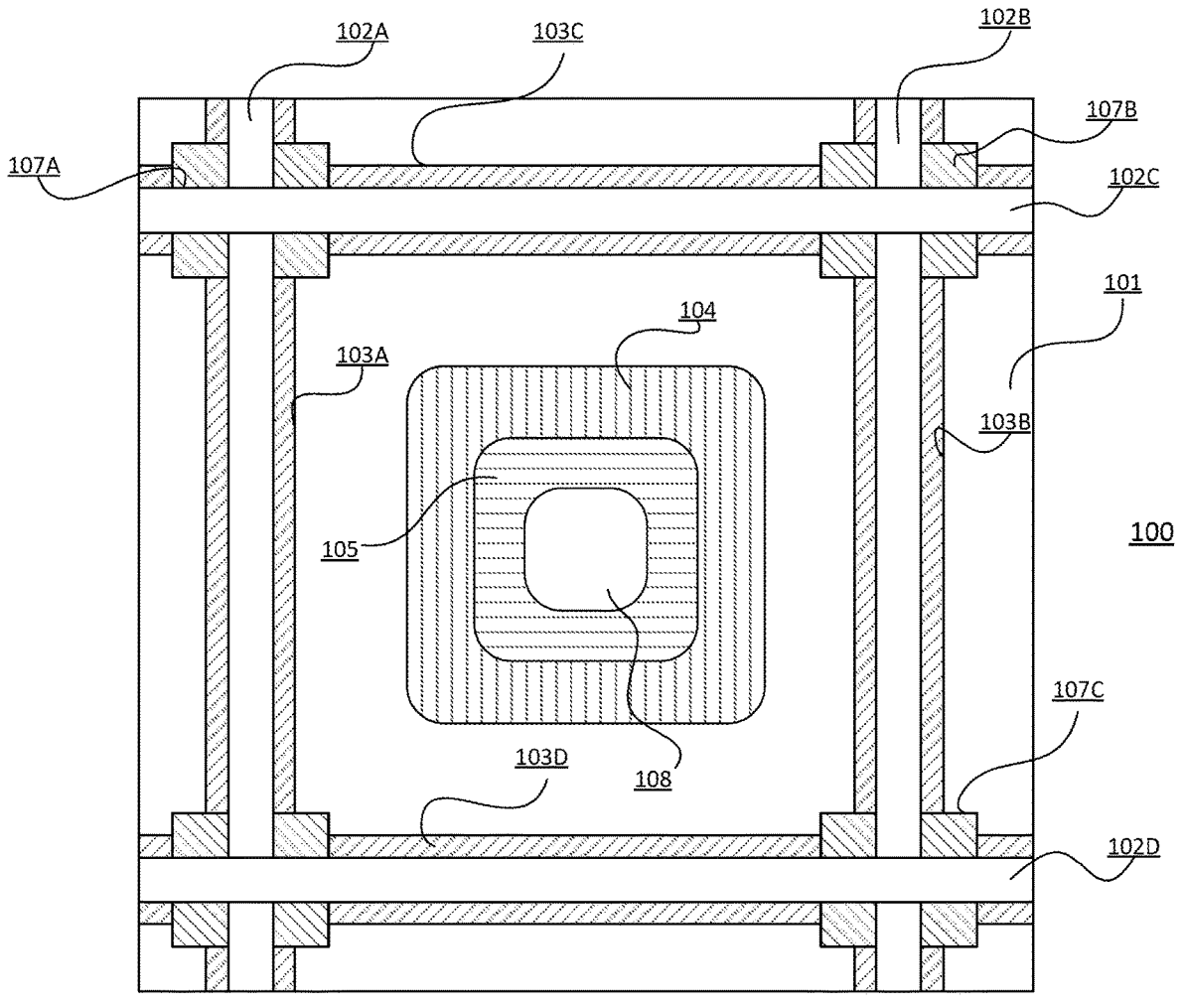

FIGS. 1A and 1B are simplified diagrams illustrating an SPAD pixel device 100 according to embodiments of the present invention. These diagrams merely provide an example, which should not unduly limit the scope of the claims. One of ordinary skill in the art would recognize many variations, alternatives, and modifications. More specifically FIG. 1A is a cross-sectional view diagram and FIG. 1B is a bird-eye view diagram. In various embodiments, a SPAD pixel device 100 is fabricated within silicon material 101. For example, silicon material 101 may be formed by an epitaxial growth process, and be referred to as an epitaxial layer or "epi". As shown, a thickness of epitaxial material ranging from about 3 um to about 12 um is grown using a high-temperature growth technique, among others. In an example, the epitaxial growth is made using the chemical vapor deposition (CVD) process. In various embodiments, SPAD pixel device 100 may be configured on a semiconductor substrate that includes wiring and circuits for inter-connecting many SPAD pixel devices. For example, p-contacts (106A and 106B) and n-contact (108) are coupled to a circuit below (not shown). As an example, the substrate may be a complementary metal-oxide silicon (CMOS) substrate, a blank or unpatterned substrate, a patterned, hybrid substrate, among others. In an example, the semiconductor substrate has a plurality of CMOS cells for logic circuitry, and can also include a plurality of memory cells, interface cells, and other circuit elements. As shown, the substrate has a bonding region and logic circuits, which can be configured as an output, quenching, recharge circuit, among others. As described below and illustrated in FIGS. 3 and 4, the SPAD sensor 100 may be coupled to a logic wafer layer via a bonding region in a stacked configuration. Of course, there can be other variations, modifications, and alternatives.

As an example, in FIG. 1A, the top side of the silicon material is referred to as "the back side" and the bottom side of the silicon material is referred to as "the front side". The terms "front" and "back" refer to the front and back sides of a semiconductor wafer during the manufacturing process, during which various processes are performed on the front side of the wafer. A BSI SPAD refers to the side where light (e.g., photons) enters the SPAD device. An aperture region 110 is located on the back side of SPAD device 100. As described below, microlens or other types of optical structures (e.g., nanostructure, antireflection coating, color filter, bandpass filter, etc.) may be configured on the aperture region 110 of the BSI SPAD pixel device 100, and these optical structures help guide incoming light and signal photons to the target region, which is the junction between the n-type material 105 and p-type material 104. The passivation layer (not shown) may be configured around the aperture region. In an example, a passivation layer may include an oxide material, a high-K dielectric material (e.g., Al2O3, HfO2, Ta2O5, etc.), a nitride material (Si3N4, SiON, etc)., or a polyimide material, combinations thereof, and the like.

The SPAD pixel device 100 is enclosed by isolation structures, which separate device 100 from neighboring SPAD pixels devices. In various embodiments, isolation structures comprise deep trench isolation (DTI) structures. For example, DIT structures 102A-D (shown in FIG. 1B) constitute the four "walls" that enclose SPAD pixel device 100. In an embodiment, the DTI structure comprises a fill material, a surrounding charge material, and a surrounding insulating material. In an example, the fill material comprises a metal material, a semiconductor material, or an insulating material. In a preferred example, the fill material is tungsten. In an example, the surrounding charge material is Al2O3. Depending on the implementation, other materials may be as well. In an example, the surrounding insulating material includes an oxide or a nitride material, among others. In an example, the surrounding insulating material is SiO2

The isolation structures may additionally include p-well regions 103A-D. In various embodiments, p-well regions are characterized by a p-type diffusion of boron. Depending on the implementation, other types of material may be used for the p-type diffusion as well. For example, p-well regions may be formed by implantation by multiple energy over an epitaxial growth base, rather than a substrate. Depending on the implementation, the isolation structures—which look like four border walls of the pixel device 100—can be implemented with DTI structures and/or p-well regions. In FIG. 1A, DTI 102A and 102B extend from the top surface of silicon material 101 all the way to shallow trench isolation (STI) structures 107A and 107B, and p-well regions 103A and 103B bordering a lower portion of the DTI structures 102A and 102B. In certain embodiments (see FIG. 10 below), DTI structures only extend to a middle region of the silicon material, and p-well regions extend between the DTI structures and STI structures. In some implementations, isolation structures may include only p-well regions and no DTI structures. In various embodiments, p-well regions 103A and 103B may be formed by an implantation process, which may use multiple energies from a few hundred keV to a few MeV. The p-well regions could be through the entire epi thickness to provide passivation and isolation.

Shallow trench isolation structures 107A and 107B are configured below the deep trench isolation. In an example, shallow trench isolation can include an oxide material as a filler. Depending on the implementation, the width and other dimensions of STI structures 107A and 107B are configured relative to the location of n-type material 105. For example, STI structures are within the width (i.e., about the same width or narrower) relative to DTI structures. P-type contacts 106A and 106B (or sometimes referred to as "P+" contacts) are configured at the bottom surface of silicon material 101. P-type contacts 106A and 106B are to be coupled to the metal contacts (e.g., copper, tungsten, etc.) of an electrical circuit (e.g., a pixel control circuit for reading the output signals of a SPAD pixel device). N-type contact 108 as shown is coupled to the n-type material 105. For example, n-type contact 108 and p-type contacts 106A and 106B may be configured using various types of implanted material (e.g., implanted silicon that is conductive).

The performance of a SPAD pixel device in large part is measured by its ability to collect—at the avalanche region 120 positioned between the p-type material 104 and n-type material 105—photon-generated carriers. For example, the avalanche region refers to a region that is within a certain proximity of the junction defined by the interface between the p-type material 104 and the n-type material 105. A large junction area translates large avalanche area for collecting photon-generated carriers, which translates to good performance. However, it is difficult to maintain the size of the junction, as the trend is to decrease the size of the SPAD pixel devices (e.g., going below 10 um). It is thus to be appreciated that embodiments of the present invention provide a design that increases the size of the junction between the p-type material 104 and n-type material 105. For example, p-type material 104 as shown (may be referred to as "P-SPAD") includes a retrograde p-well. For example, the P-SPAD may be formed by implantation processes (e.g., with one or more implantation energy). The region of p-type material 104, as implemented in various embodiments, is associated with a non-uniform doping concentration profile. For example, the doping concentration is the greatest near the active junction region at which p-type material 104 interfaces with n-type material 105.

N-type material 105, as shown, may include a n-well. For example, n-type material 105 may be referred to as "N-SPAD". N-SPAD may be formed by an implantation process, which could use multiple implantation energy levels. An important aspect of n-type material 105 is its dimensions: n-type material 105 is narrower than p-type material 104 as shown. The junction between p-type material 104 and n-type material 105 includes both the horizontal interface and the vertical interface as shown in FIG. 1A. More specifically, the bottom surface of p-type material 104 interfaces with the top surface of n-type material 105. And because p-type material 104 is wider and encloses n-type material 105, the top sidewalls of n-type material 105 also interface with p-type material 104. Compared to conventional designs, the sidewall portions of the junction interfaces create a lateral electrical field and increase the total area for collecting the photon-generated carriers. Depending on the implementation, the dimensions of N-SPAD and P-SPAD may vary, but the width of P-SPAD is always greater than the width of N-SPAD, and P-SPAD includes a region that partially encloses the N-SPAD.

In various embodiments, the n-material 105 is also formed by a second implantation process, and certain n-type dopants are implanted into a portion of p-type material. The n-type implantation is at least 1 μm away from the p-well regions 103A and 103B to avoid direct carrier path from p-well regions 103A and 103B to the n-type contact 108 without passing through the avalanche region. The placement of the n-type material 105 is also to avoid the avalanche region 120 extending from the desired junction area to the front surface.

For example, the implanted p-type material comprises a boron material having a concentration density of 1E15 atoms/cm3 to 1E18 atoms/cm3. For example, the implanted n-type material comprises a phosphorous entity or an arsenic entity having a concentration density of 1E17 atoms/cm3 to 1E19 atoms/cm3. Of course, there can be other variations, modifications, and alternatives. As shown, the implanted p-type material and the implanted n-type material are configured within a vicinity of the semiconductor substrate of the pixel element or near the bonding region.

The operating voltage (e.g., at region 120) is at about lower than 5 volts. At the same time, it is to be noted that voltage is much higher at region 101. For example, the voltage at region 101 may be over 20 volts, sometimes 30 volts. It is important, as explained below, that the voltage at region 101 is not electrically coupled (e.g., shorted) to logic circuits.

Figure 2:
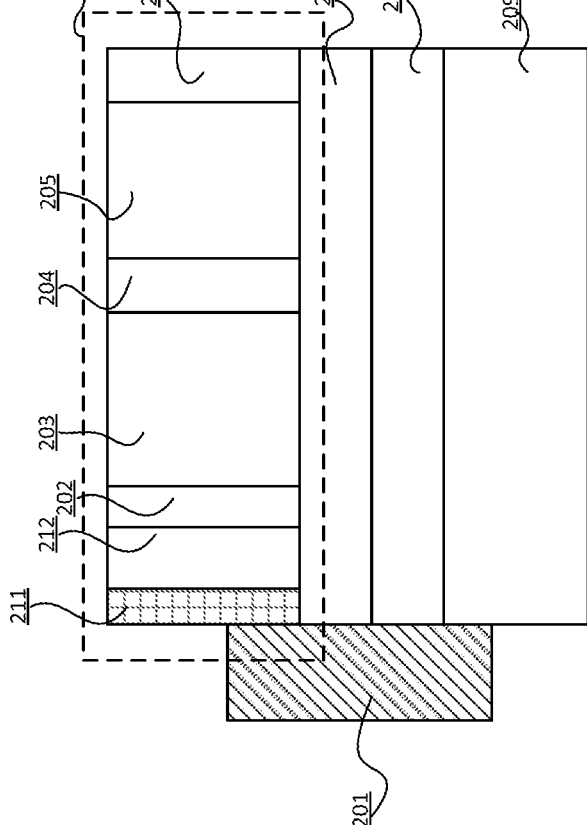
FIG. 2 is a simplified diagram illustrating shorting problems of a stacked SPAD sensor device 200 according to embodiments of the present invention.

FIG. 2 is a simplified diagram illustrating shorting problems of a stacked SPAD sensor device 200 according to embodiments of the present invention. This diagram is merely an example, which should not unduly limit the scope of the claims. One of ordinary skill in the art would recognize many variations, alternatives, and modifications. Device 200 includes a sensor layer 210 and a logic layer 209. In various embodiments, sensor layer 210 is configured on a sensor wafer, and logic layer 209 is configured on a logic wafer. Sensor layer 210 and logic layer 209 are bonded to each other via regions 207 and 208. As an example, region 207 is a part of a sensor wafer, and region 208 is a part of the logic wafer. In a stacked configuration, region 207 and region 208 are bonded to each other with electrical contacts, as illustrated in FIGS. 3 and 4.

Sensor layer 210 includes an array of SPAD sensor pixels that are separated by DTI structures. For example, pixels 203 and 205 are separated by DTI structure 204. For example, each of the SPAD pixels is surrounded by DTI structures as described above. For example, pixel 203 is surrounded by DTI structures 202 and 204, and two more DTI structures are not shown; pixel 205 is surrounded by DTI structures 204 and 206, and another two more DTI structures are not shown. On a sensor wafer, there is a peripheral region surrounding the array of SPAD sensors and outside of the DTI structures (e.g., DTI structures are parts of the SPAD sensors array). For example, region 212 and region 211 are both in the peripheral region, which comprises substrate material (e.g., silicon oxide). Region 211 is a region of concern, at where the sensor wafer 210 was diced. Unfortunately, region 211 is often—unintentionally and undesirably—electrically coupled to the logic layer 209 below. The SPAD sensor operates at high voltage; the substrate of sensor wafer 210 is at a relatively high voltage during operation. In comparison, the circuits configured at the logic wafer 209 normally operates at a relatively lower voltage (e.g., less than 5V). While the outputs of the SPAD sensors of the sensor wafer 210 are electrically coupled to the corresponding logic circuits configured in the logic wafer 209, the substrate of sensor wafer 210 and the substrate of the logic wafer 209 should not be electrically coupled to due to the high voltage difference. Unfortunately, during the packaging process, sensor wafer 201 is diced (or otherwise cut) along region 211. During the dicing process, debris or other material may be deposited around region 201, forming an undesirable electrical connection between region 211 and region 209. Additionally, region 211 and region 209 may be electrically coupled—with various types of conductive materials-unintentionally in other ways, thereby causing a large current flowing from the sensor wafer to the logic substrate and damaging the logic functions. Therefore, it is to be appreciated that electrically insulation mechanisms are implemented in region 211 to prevent unintended electrical coupling.

Figure 3:
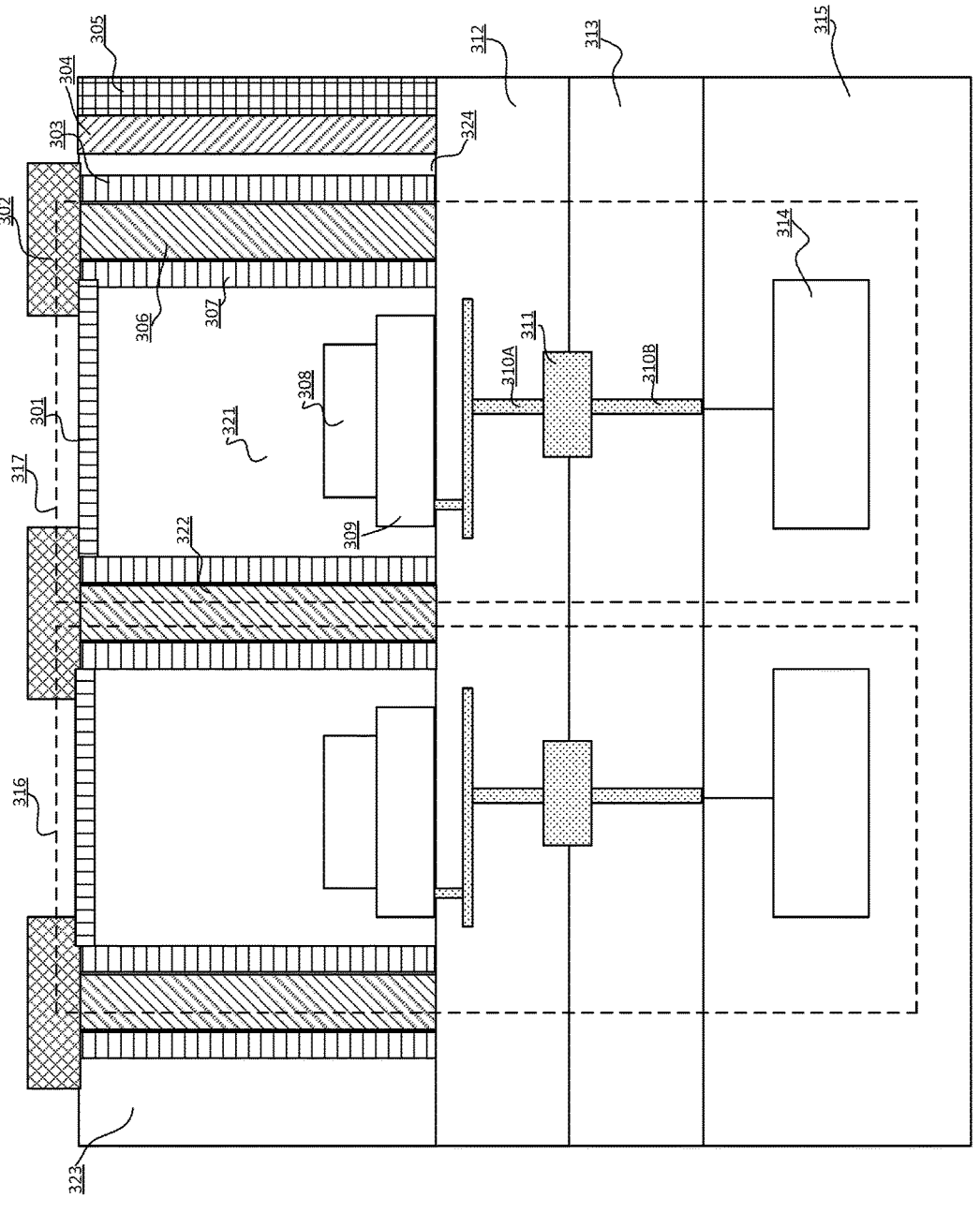
FIG. 3 is a simplified diagram illustrating a stacked SPAD sensor device 300 with a floating insulation region according to embodiments of the present invention.
Figure 4:
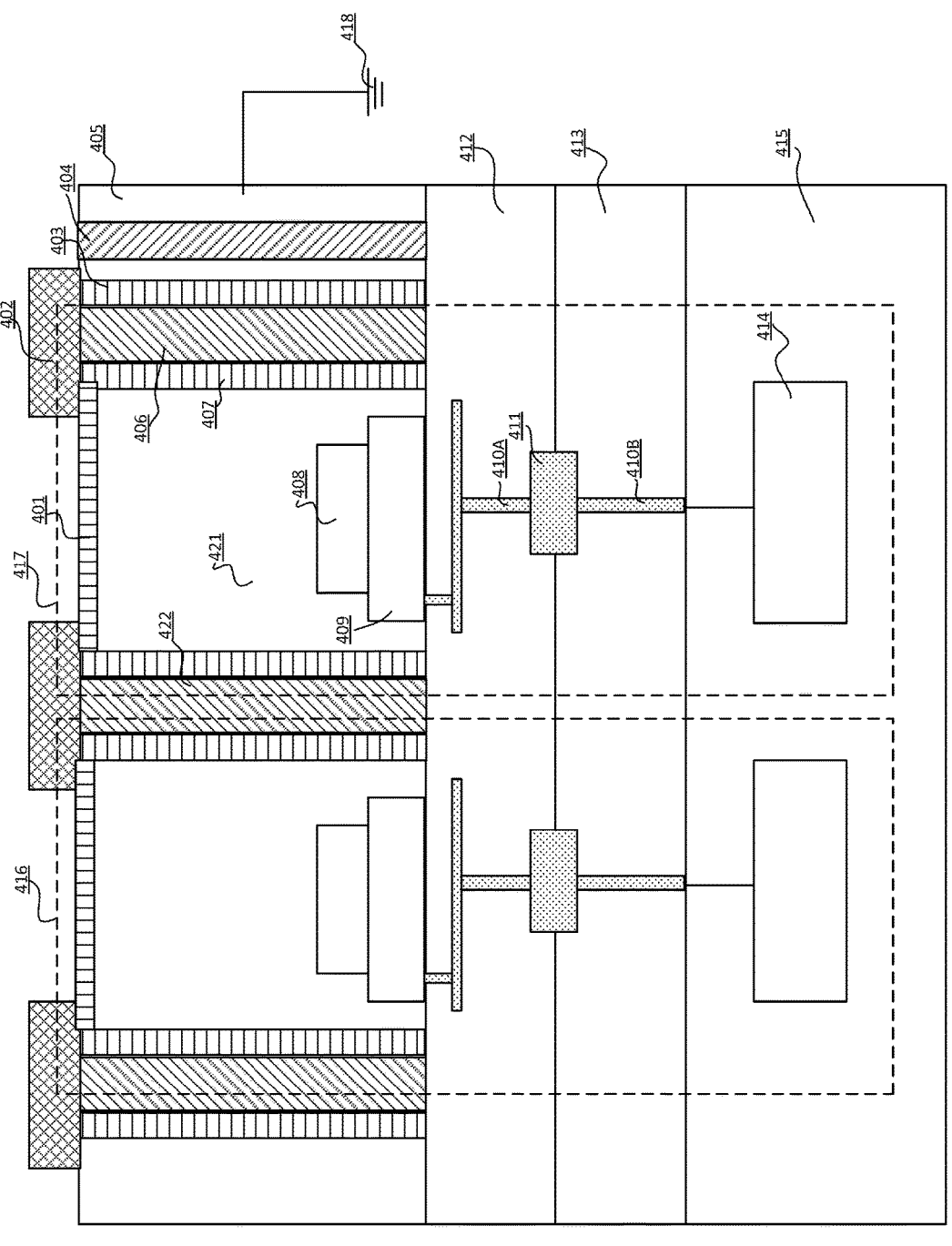
FIG. 4 is a simplified diagram illustrating a stacked SPAD sensor device 400 with a grounded insulation region according to embodiments of the present invention.

FIG. 3 is a simplified diagram illustrating a stacked SPAD sensor device 300 with a floating insulation region according to embodiments of the present invention. This diagram is merely an example, which should not unduly limit the scope of the claims. One of ordinary skill in the art would recognize many variations, alternatives, and modifications. Sensor device 300, as an example, includes two SPAD pixel units 316 and 317, each having its sensor region and logic region connected to each other via a bonding region. In various embodiments, the sensor region includes region 312, which includes electrical connection 310A (e.g., wires) for coupling to the electrical connection 310B via bonding 311. For example, bonding 311 provides a copper-to-copper hybrid bonding, but it is understood other types of metals or connection mechanisms may be used as well. Electrical connection 310B is configured at region 313, which is a part of the logic wafer. Electrical connection 310B, as shown, is coupled to logic circuit 314, which operates at a voltage of about 5 volts or lower. For example, region 312 is a part of a SPAD sensor wafer, and region 313 is a part of a logic circuit wafer, and region 312 and region 313 are bonded to each other to form a stacked structure that includes both the sensor wafer and the logic circuit wafer.

In various implementations, the sensor regions include their respective SPAD p-n junctions without other CMOS circuits, as logic circuits or others are implemented in the stacked structures below. As an example, SPAD pixel unit 317 includes substrate 321. For example, substrate 321 includes silicon oxide material, which may be formed using epitaxial growth processes. A p-n junction is formed between p region 308 and n region 309. As explained above, an avalanche region between the p region 308 and n region 309 generates electrical signals in response to the photons entering the SPAD sensor region. The SPAD sensor regions of pixel units 316 and 317 are each surrounded by DTI structures. As shown, the SPAD sensor region of pixel unit 317 is surrounded by DTI structures 322 and 306. DTI structure 322 additionally provides separation between pixel units 317 and 316. In various implementations, DTI structures are configured between sidewall structures. For example, DTI 306 is configured between sidewalls 307 and 303. Among other features, DTI structures prevent photons entering one sensor region from entering another sensor region; DTI structures provide optical insulation. Unfortunately, the DTI structure may not provide electrical insulation that is needed for SPAD sensors near dicing areas.

As explained above, the voltage at the sensor region can be high relative to that of the logic circuit. For example, the voltage at substrate 321 may be much higher than the operating voltage (e.g., about 5 volts or lower) of logic circuit 314. It is to be noted that while the sensor substrate operates at a relatively high voltage, the output signal, as coupled to electrical contacts 302 and 310A, is at the voltage range of the logic circuit 314. Because DTI does not provide effective electrical insulation, regions 323 and 324 may have relatively high voltage due to their electrical connection to the sensor substrate. An insulation trench 304 is provided next to region 303 to provide electrical insulation between substrate 321 and region 305. For example, region 305 contains electrically conductive substrate material (e.g., same as substrate 321), but due to electrical insulation 304, the high voltage of substrate 321 is not imparted to region 305. In some embodiments, non-conductive material may be provided at region 305 to provide further electrical insulation. It is to be appreciated that thanks to electrical insulation 304, logic circuit 314 is "floating" and insulated from the high voltage of substrate 321; even if region 305 is electrically coupled (e.g., due to undesirable shooting of dicing debris) to the logic circuit region 315, logic circuit 314 is insulated from the high voltage of substrate 321.

FIG. 4 is a simplified diagram illustrating a stacked SPAD sensor device 400 with a grounded insulation region according to embodiments of the present invention. This diagram is merely an example, which should not unduly limit the scope of the claims. One of ordinary skill in the art would recognize many variations, alternatives, and modifications. Sensor device 400, as an example, includes two SPAD pixel units 416 and 417, each having its sensor region and logic region connected to each other via a bonding region. In various embodiments, the sensor region includes region 412, which includes electrical connection 410A (e.g., wires) for coupling to the electrical connection 410B via bonding 411. For example, bonding 411 provides a copper-to-copper hybrid bonding, but it is understood other types of metals or connection mechanisms may be used as well. Electrical connection 410B is configured at region 413, which is a part of the logic wafer. Electrical connection 410B, as shown, is coupled to logic circuit 414, which operates at a voltage of about 5 volts or lower. For example, region 412 is a part of a SPAD sensor wafer, region 413 is a part of a logic circuit wafer, and region 412 and region 413 are bonded to each other to form a stacked structure that includes both the sensor wafer and the logic circuit wafer.

In various implementations, the sensor regions include their respective SPAD p-n junctions without other CMOS circuits, as logic circuits or others are implemented in the stacked structures below. As an example, SPAD pixel unit 417 includes substrate 421. For example, substrate 421 includes silicon oxide material, which may be formed using epitaxial growth processes. A p-n junction is formed between p region 408 and n region 409. As explained above, an avalanche region between the p region 408 and n region 409 generates electrical signals in response to the photons entering the SPAD sensor region. The SPAD sensor regions of pixel units 416 and 417 are each surrounded by DTI structures. As shown, the SPAD sensor region of pixel unit 417 is surrounded by DTI structures 422 and 406. DTI structure 422 additionally provides separation between pixel units 417 and 416. In various implementations, DTI structures are configured between sidewall structures. For example, DTI 406 is configured between sidewalls 407 and

403. Among other features, DTI structures prevent photons entering one sensor region from entering another sensor region; DTI structures provide optical insulation. Unfortunately, DTI structure may not provide electrical insulation that is needed for SPAD sensors near dicing areas.

As explained above, the voltage at the sensor region can be high relative to that of the logic circuit. For example, the voltage at substrate 421 may be much higher than the operating voltage (e.g., about 5 volts or lower) of logic circuit 414. It is to be noted that while the sensor substrate operates at a relatively high voltage, the output signal, as coupled to electrical contacts 402 and 410A, is at the voltage range of the logic circuit 414. Because DTI does not provide effective electrical insulation, regions 423 and 424 may have relatively high voltage due to their electrical connection to the sensor substrate. An insulation trench 404 is provided next to region 403 to provide electrical insulation between substrate 421 and region 405. Region 405 is coupled to a ground terminal 418. In various embodiments, logic circuit 414 is coupled to a ground terminal. For example, region 405 and logic circuit 414 may share a ground terminal. Because the voltage at the sensor circuit is high and the voltage at region 405 is low (i.e., grounded or zero), insulation trench 404 is configured to withstand a large amount of voltage difference. In various embodiments, insulation trench 404 comprises non-conductive silicon oxide material and is characterized by a thickness of at least 100 nanometers and up to 1500 nanometers. Insulation trench 404 formed after bonding (in BSI process, the pn junction is formed first, then the backside forming trench). Spacing from DTI, 324 thickness (distance from DTI to insulation) is typically few hundred microns. 324 is conductive, semiconductor material.

Figure 5:
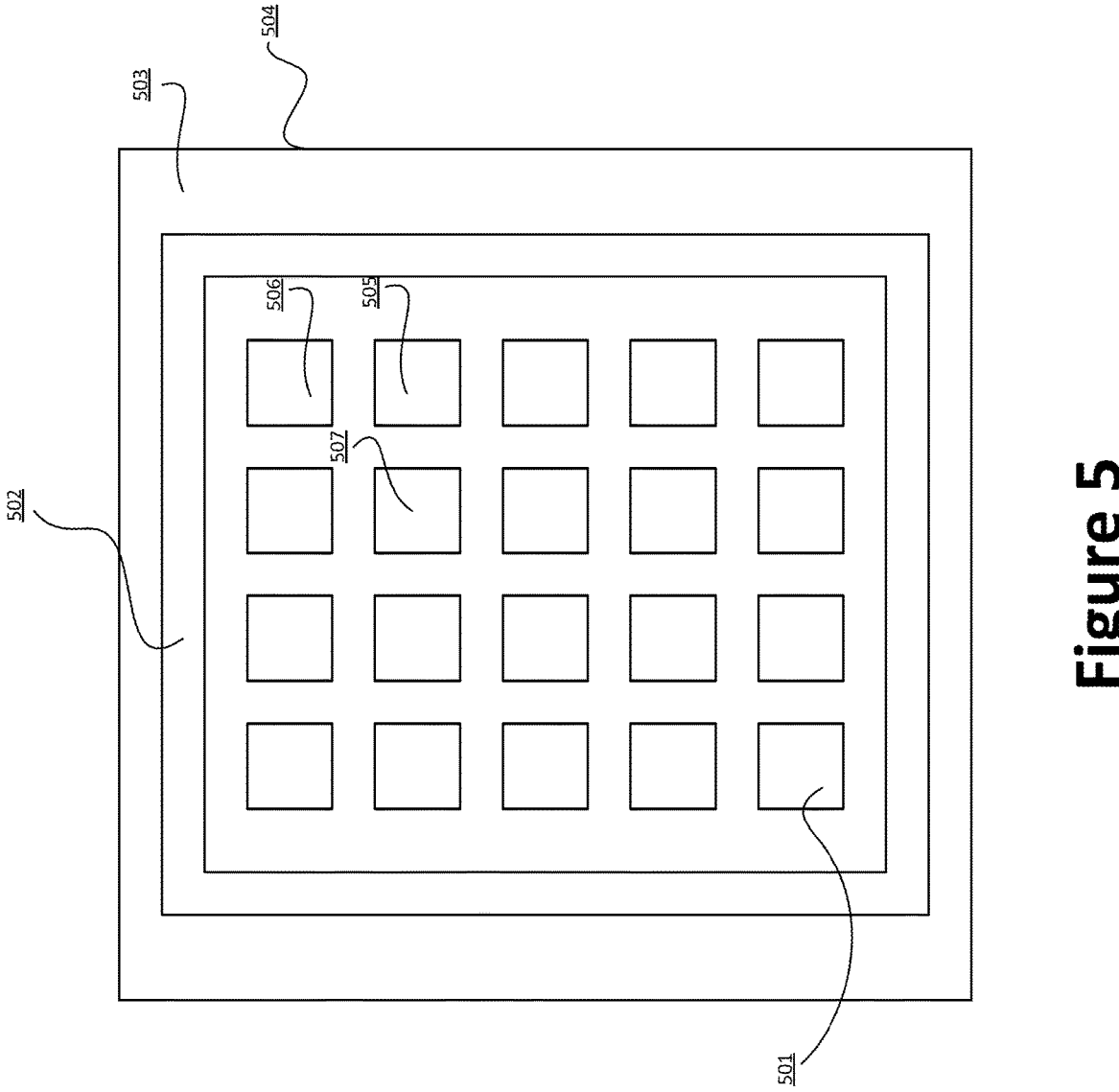
FIG. 5 is a simplified diagram illustrating a top view of a SPAD sensor device 500 according to embodiments of the present invention.

FIG. 5 is a simplified diagram illustrating a top view of a SPAD sensor device 500 according to embodiments of the present invention. This diagram is merely an example, which should not unduly limit the scope of the claims. One of ordinary skill in the art would recognize many variations, alternatives, and modifications. SPAD sensor device 500, for the purpose of illustration, includes 20 SPAD sensor pixels. As an example, sensor pixel 507 is separated from its surrounding pixels by DTI structures. For example, a DTI structure (not shown) separates pixel 507 from pixel 505. Pixel 505 is surrounded by DTI structures that provide separation from pixels 507 and 506. Additionally, pixels 505 and 506 also include DTI structures that provide separation from the insulation trench 502. For example, insulation trench 502 may be configured similar to insulation trenches 304 and 404 respectively in FIGS. 3 and 4. Insulation trench 502 fully surrounds the array of SPAD pixels from pixel 506 at the top right to pixel 501 at the bottom left, thereby preventing undesirable current from flowing from the pixels (or their substrates) to region 503. For example, edge 504 is formed via dicing processes, and electrically conductive debris may deposit on the surface of edge 504. In certain implementations, region 503 is electrically insulated from SPAD pixels by insulation trench 502. In some embodiments, region 503 is electrically insulated by insulation trench 502 and is additionally grounded.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A stacked SPAD sensor device comprising:
a sensor layer characterized by a first thickness;
a logic layer characterized by a second thickness;
a bonding layer characterized by a third thickness, the bonding layer being positioned between the sensor layer and the logic layer;
an array of SPAD pixel circuits configured in the sensor layer, the array of SPAD pixel circuits including a first pixel circuit and a second pixel circuit, the first pixel circuit comprising a first p-n junction positioned and a first substrate between a first sidewall and a second sidewall, the first p-n junction being characterized by a first operating voltage of at least 10 volts, the second pixel circuit comprising a second p-n junction and a second substrate positioned between the second sidewall and a third sidewall;
a first logic circuit positioned in the logic layer;
one or more insulation walls surrounding the array of SPAD pixel circuits, the one or more insulation walls positioned in the sensor layer, the first substrate being electrically insulated from the logic layer;
a floating region positioned adjacent to the one or more insulation walls, the floating region being electrically insulated from the array of SPAD pixel circuits and providing an insulation between the first logic circuit and the first substrate; and
a first electrical connector positioned in the bonding layer, the first electrical connector being coupled to the first p-n junction and the first logic circuit;
wherein the first substrate operates at a first voltage, the first logic circuit operates a second voltage, the second voltage being lower than the first voltage and the first logic circuit being inoperable at the first voltage, the insulating wall being adjacent to a region electrically coupled to the substrate and the first voltage.

2. The stacked SPAD sensor device of claim 1 wherein the one or more insulation walls comprising four walls enclosing the array of SPAD pixel circuits.

3. The stacked SPAD sensor device of claim 1 wherein the first logic circuit is characterized by a second operating voltage of 5 volts or less.

4. The stacked SPAD sensor device of claim 1 further comprising:
a second logic circuit positioned in the logic layer; and
a second electrical connector positioned in the bonding layer, the second electrical connector being coupled to the second p-n junction and the second logic circuit.

5. The stacked SPAD sensor device of claim 1 wherein the one or more insulation walls are characterized by a fourth thickness, the fourth thickness being no greater than the first thickness.

6. The stacked SPAD sensor device of claim 1 further comprising a first passivation layer overlaying the first substrate and a second passivation layer overlaying the second substrate.

7. The stacked SPAD sensor device of claim 1 wherein the first sidewall comprises a deep trench isolation structure.

8. The stacked SPAD sensor device of claim 1 further comprising a floating region positioned adjacent to the one or more insulation walls, the floating region being electrically grounded.

9. The stacked SPAD sensor device of claim 1 further comprising a floating region positioned adjacent to the one or more insulation walls, the float region comprising a dicing surface.

10. A stacked SPAD sensor device comprising:
a sensor layer characterized by a first thickness;
a logic layer characterized by a second thickness;
a bonding layer interfacing between the sensor layer and the logic layer;
a SPAD pixel circuit comprising a p-n junction positioned and a substrate between a first sidewall and a second sidewall;
a logic circuit positioned in the logic layer;
an insulation region positioned in the sensor layer and coupled to a ground terminal;
an insulation wall separating the SPAD pixel circuit and the insulation region, the insulation wall positioned in the sensor layer, the substrate being electrically insulated from the logic layer; and
a floating region positioned adjacent to insulation wall, the floating region being electrically insulated from the SPAD pixel circuit and providing an insulation between the logic circuit and the substrate;
wherein the first substrate operates at a first voltage, the first logic circuit operates a second voltage, the second voltage being lower than the first voltage and the first logic circuit being inoperable at the first voltage, the insulating wall being adjacent to a region electrically coupled to the substrate and the first voltage.

11. The stacked SPAD sensor device of claim 10 wherein the insulation region is coupled to the ground terminal through the bonding layer.

* * * * *